US008269231B2

(12) United States Patent
Tsang

(10) Patent No.: US 8,269,231 B2
(45) Date of Patent: Sep. 18, 2012

(54) LIGHT EMITTING DIODE MODULE PROVIDING STABLE COLOR TEMPERATURE

(75) Inventor: Jian-Shihn Tsang, New Taipei (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 4 days.

(21) Appl. No.: 13/074,021

(22) Filed: Mar. 29, 2011

(65) Prior Publication Data

US 2012/0146058 A1 Jun. 14, 2012

(30) Foreign Application Priority Data

Dec. 14, 2010 (CN) .................................. 99 1 43835

(51) Int. Cl.

| | |
|---|---|
| ***H01L 29/00*** | (2006.01) |
| ***H01L 33/00*** | (2010.01) |
| ***H01L 21/66*** | (2006.01) |
| ***H01L 21/00*** | (2006.01) |

(52) U.S. Cl. ................ 257/88; 257/89; 257/98; 438/28; 438/29; 438/35

(58) Field of Classification Search .................... 438/28, 438/29, 35; 257/88, 89, 98, E33.076, E33.07, 257/E33.061

See application file for complete search history.

(56) References Cited

U.S. PATENT DOCUMENTS

| | | | | |
|---|---|---|---|---|
| 2003/0030063 | A1 * | 2/2003 | Sosniak et al. | 257/89 |
| 2007/0045524 | A1 * | 3/2007 | Rains et al. | 250/228 |
| 2008/0068821 | A1 * | 3/2008 | Wang et al. | 362/84 |
| 2009/0294788 | A1 * | 12/2009 | Rosler et al. | 257/98 |
| 2010/0118374 | A1 * | 5/2010 | Quach | 359/239 |
| 2010/0258712 | A1 * | 10/2010 | Wiese et al. | 250/237 R |
| 2011/0176289 | A1 * | 7/2011 | Ramer et al. | 362/84 |
| 2011/0291564 | A1 * | 12/2011 | Huang | 315/77 |

* cited by examiner

*Primary Examiner* — Kevin Parendo

(74) *Attorney, Agent, or Firm* — Altis Law Group, Inc.

(57) ABSTRACT

A light emitting diode module providing stable color temperature includes a plurality of light emitting diodes, at least one color sensor and a controller. The plurality of light emitting diodes can emit light with different wavelengths. The light emitting diode module providing stable color temperature includes a reflection region at the path of the light emitting from half peak angle of each light emitting diode. The color sensor detects the light having different wavelengths reflected from the reflection region. The controller adjusts driving currents of the light emitting diodes according to the luminous intensities of the light of the light emitting diodes reflected by the reflection region and detected by the color sensor.

4 Claims, 2 Drawing Sheets

LIGHT EMITTING DIODE MODULE PROVIDING STABLE COLOR TEMPERATURE

BACKGROUND

1. Technical Field

The disclosure relates to light emitting diodes, and particularly to a light emitting diode module emitting light of stable color temperature.

2. Description of the Related Art

Light emitting diodes' (LEDs) many advantages, such as high luminosity, low operational voltage, low power consumption, compatibility with integrated circuits, easy driving, long term reliability, and environmental friendliness have promoted their wide use as a light source. Now, light emitting diodes are commonly applied in environmental lighting.

It is well known that white light is commonly composed of red, blue, and green light. A ratio of the luminous intensities of red, blue, and green light is 2:6:1. However, it is noted that the ratio of luminous intensities of red, blue, and green light is substantially affected by high temperature.

Therefore, it is desirable to provide a light emitting diode module which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present light emitting diode module providing stable color temperature. Moreover, in the drawings, like reference numerals designate corresponding parts throughout the views.

DETAILED DESCRIPTION

Embodiments of a light emitting diode module providing stable color temperature as disclosed are described in detail here with reference to the drawings.

Figure 1:
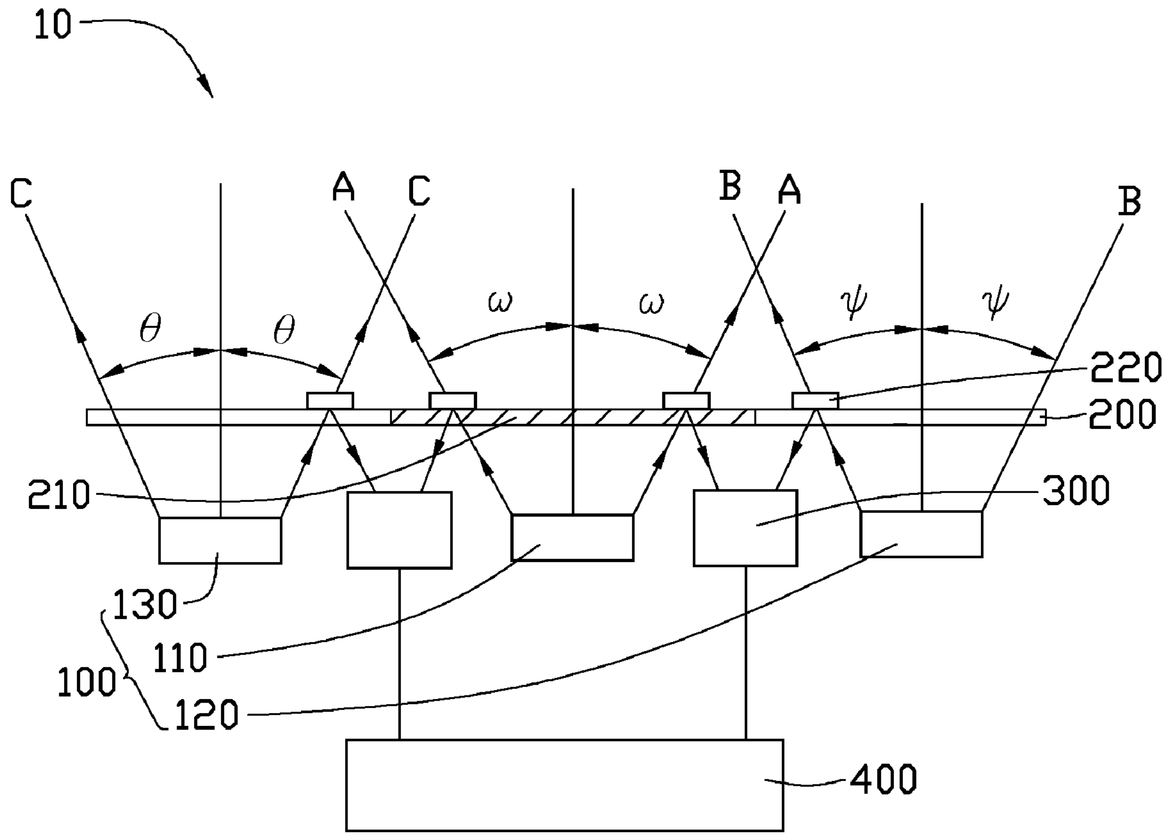
FIG. 1 is a schematic view of a light emitting diode module providing stable color temperature in accordance with a first embodiment.

Referring to FIG. 1, a light emitting diode module providing stable color temperature 10 includes a plurality of light emitting diodes 100, a fluorescent piece 200, at least one color sensor 300, and a controller 400.

The plurality of light emitting diodes 100 includes an ultraviolet light emitting diode 110, a red light emitting diode 120 and a blue light emitting diode 130 at two sides of the ultraviolet light emitting diode 110. According to the characteristic of the light emitting diodes 100, the luminous intensity of the half peak angle of light from light emitting diode 100 is half of the maximum luminous intensity of light from light emitting diode 100 in a normal direction. In this embodiment, according to the ultraviolet light emitting diode 110, light at a half peak angle of the ultraviolet light emitting diode 110 is defined as A. The angle between the light at the half peak angle A and the light in a normal direction of the ultraviolet light emitting diode 110 is defined as $\omega$. Light at the half peak angle of the red light emitting diode 120 is defined as B. The angle between the light at the half peak angle and the light in a normal direction of the red light emitting diode 120 is defined as $\phi$. Light at the half peak angle of the blue light emitting diode 130 is defined as C. The angle between the light at half peak angle and the light in a normal direction of the blue light emitting diode 130 is defined as $\theta$. The luminous intensities of the half peak angle of red, blue, and ultraviolet light are respectively half of the maximum luminous intensities of red, blue, and ultraviolet light in a normal direction.

The fluorescent piece 200 is situated in and shelters the light emitting path of the plurality of the light emitting diodes 100. The region of the fluorescent piece 200 corresponding to the ultraviolet light emitting diode 110 includes a plurality of green fluorescent powders 210. The remaining region includes no green fluorescent powders 210. The green fluorescent powders 210 excited by the ultraviolet light emitting diode 110 produce a green light. White light is generated by the combined green light, red light from the red light emitting diode 120, and blue light from the blue light emitting diode 130. In this embodiment, the fluorescent piece 200 further includes a plurality of light diffusion particles. The intersection region between a surface of the fluorescent piece 200 and light of the ultraviolet light emitting diode 110, the red light emitting diode 120, or the blue light emitting diode 130 at the half peak angle is coated with a reflection layer 220 and forms a plurality of reflection regions. The reflection layer 220 can be curved facing the light emitting diode 100, thereby increasing the convergence effect of the reflection layer 220. In this embodiment, the reflection layer 220 is a high reflection film or a partial penetration reflection film.

The color sensor 300 detects the luminous intensities of light having different wavelengths from the plurality of the light emitting diodes 100 reflected at the reflection layer 220. In this embodiment, two color sensors 300 are respectively arranged between the ultraviolet light emitting diode 110 and the red light emitting diode 120, and between the ultraviolet emitting diode 110 and the blue light emitting diode 130. A part of the green fluorescent powers 210 excited by light from the ultraviolet light emitting diode 110 produces a green light, a part of light from the red light emitting diode 120, and a part of light from the blue light emitting diode 130 respectively reflected at the reflection layer 300 travel to the color sensors 300. The color sensors 300 respectively detect the luminous intensities of green, red, and blue light reflected thereon.

The controller 400 connects with the color sensors 300. According to the luminous intensities of the different wavelengths of green, red, and blue light detected by the color sensors 300, the ratio of the luminous intensities of green, red, and blue light is ensured and driving voltage of each light emitting diode 100 is adjusted accordingly. In this embodiment, according to the luminous intensities of red, green, and blue light detected by the color sensors 300 to ensure the ratio of the luminous intensities of red, green, and blue light, the driving currents of the ultraviolet light emitting diode 110, the red light emitting diode 120, and the blue light emitting diode 130 are adjusted corresponding to the predetermined ratio of luminous intensities of green, red, and blue light.

The luminous intensity of each light emitting diode 100 at the half peak angle is a half of the luminous intensity of each light emitting diode 100 in a normal direction (90°). According to this characteristic, the luminous intensities of light of light emitting diodes 100 at the half peak angle are reference resource. By comparing the luminous intensities of green, red, and blue light detecting by the color sensor 300 to the luminous intensities predetermined beforehand, the driving currents of the ultraviolet light emitting diode 110, the red light emitting diode 120, and the blue light emitting diode 130 are adjusted. Thus, the light emitting diode module 10 substantially provides light of stable color temperature.

According to specific needs, the plurality of light emitting diodes 100 are not limited to the ultraviolet light emitting diode 100, the red light emitting diode 120 and the blue light emitting diode 130 of this embodiment.

Figure 2:
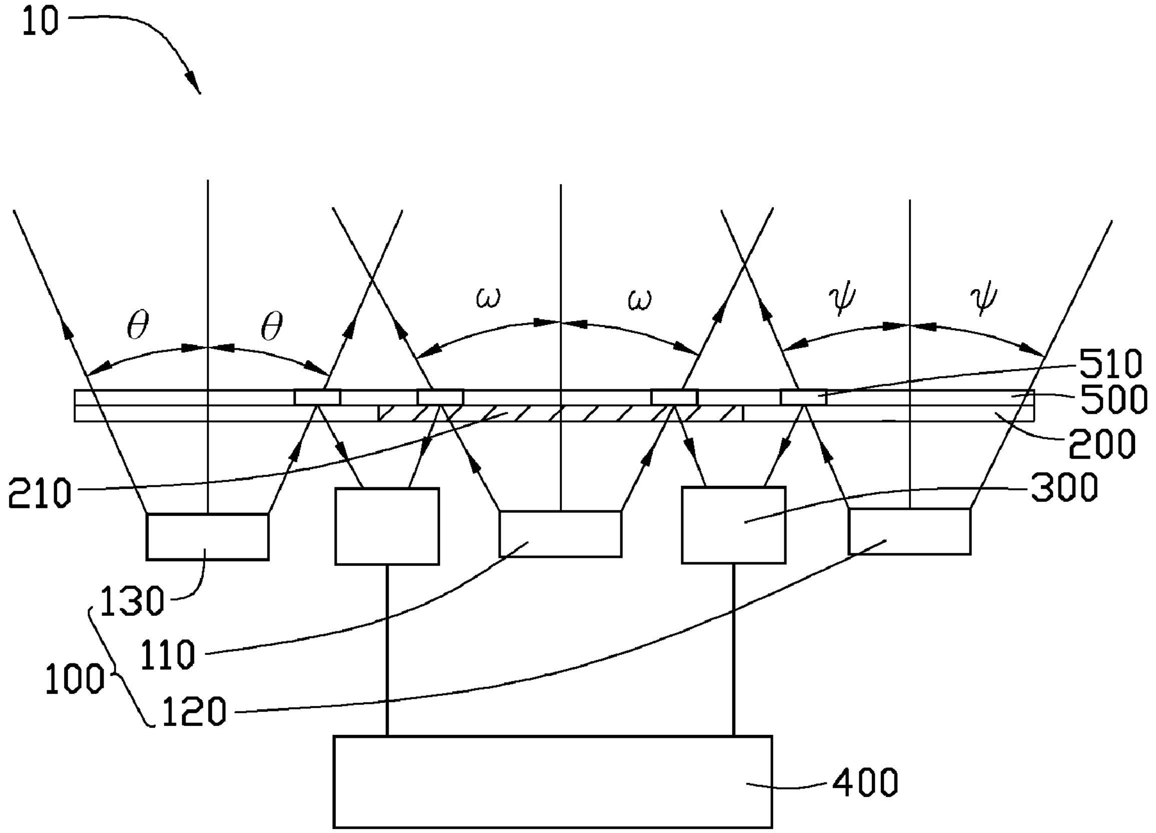
FIG. 2 is a schematic view of a light emitting diode module providing stable color temperature in accordance with a second embodiment.

Referring to FIG. 2, a light emitting diode module providing stable color temperature 10 in accordance with a second embodiment differs from the first embodiment only in the further inclusion of a reflection film 500 on a surface of a fluorescent piece 200. The intersection region between the reflection film 500 and light A, B, or C of the ultraviolet light emitting diode 110, the red light emitting diode 120, and the blue light emitting diode 130 at the half peak angle forms a reflection region 510, and the remainder is a transparent region.

A part of the green light which is produced by the ultraviolet light emitting diode 110 exciting the green fluorescent powders 210 of the fluorescent piece 200, a part of light from the red light emitting diode 120, and a part of light from the blue light emitting diode 130 respectively reflected at the reflection region 510 of the reflection film 500 travel to the color sensors 300. The color sensors 300 detects the luminous intensities of green, red, and blue light reflected thereon. Driving currents of the ultraviolet light emitting diode 100, the red light emitting diode 120 and the blue light emitting diode 130 are adjusted by the controller 400 according to the luminous intensities of the green, red, and blue light detected by the color sensors 300.

As disclosed, the reflection region 510 formed at the light emitting direction of the half peak angle of each of the light emitting diode 100 of the light emitting diode module provides stable color temperature 10. The luminous intensities of different wavelengths of green, red, and blue light reflected at the reflection region are detected by the color sensors 300. According to the luminous intensities of green, red, and blue light, the driving currents of the light emitting diodes 100 are adjusted, increasing the stability of color temperature.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode module, comprising: a plurality of light emitting diodes emitting lights having different wavelengths from each other, wherein the plurality of light emitting diodes includes an ultraviolet light emitting diode, a red light emitting diode, and a blue light emitting diode, at least one color sensor, a controller and a fluorescent piece covering light emitting paths of the plurality of light emitting diodes, wherein a reflection region is formed at a half peak angle of each light emitting diode, the at least one color sensor detects luminous intensities of the lights having different wavelengths reflected at the reflection region, and driving currents to the plurality of light emitting diodes are adjusted by the controller according to the luminous intensities of lights detected by the at least one color sensor;

wherein a region of the fluorescent piece corresponding to the ultraviolet light emitting diode has a plurality of green fluorescent powders; and wherein an intersection region between a surface of the fluorescent piece and half peak angle light of each of the ultraviolet light emitting diode, the red light emitting diode, and the blue light emitting diode is coated with a reflection layer to form the reflection region.

2. The light emitting diode module of claim 1, wherein the fluorescent piece includes a plurality of light diffusion particles.

3. The light emitting diode module of claim 1, wherein the reflection layer is arc-shaped.

4. A light emitting diode module, comprising:

a plurality of light emitting diodes emitting lights having different wavelengths from each other, wherein the plurality of light emitting diodes includes an ultraviolet light emitting diode, a red light emitting diode, and a blue light emitting diode;

at least one color sensor;

a controller; and a fluorescent piece covering light emitting paths of the plurality of light emitting diodes;

wherein a reflection region is formed at a half peak angle of each light emitting diode, the at least one color sensor detects luminous intensities of the lights having different wavelengths reflected at the reflection region, and driving currents to the plurality of light emitting diodes are adjusted by the controller according to the luminous intensities of lights detected by the at least one color sensor;

wherein a region of the fluorescent piece corresponding to the ultraviolet light emitting diode has a plurality of green fluorescent powders; and wherein a reflection film is mounted on a surface of the fluorescent piece, intersection regions between the reflection film and the lights of the ultraviolet light emitting diode, the red light emitting diode, and the blue light emitting diode at the half angle peaks of the light emitting diodes form reflection regions, and the remainder of the reflection film except the reflection regions forms transparent regions.

* * * * *